United States Patent
Nishikawa et al.

(10) Patent No.: US 6,468,589 B2
(45) Date of Patent: Oct. 22, 2002

(54) COMPOSITION FOR FILM FORMATION AND INSULATING FILM

(75) Inventors: Michinori Nishikawa, Ibaraki (JP); Takashi Okada, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/771,970

(22) Filed: Jan. 30, 2001

(65) Prior Publication Data

US 2001/0012870 A1 Aug. 9, 2001

(30) Foreign Application Priority Data

Feb. 2, 2000 (JP) ........................................ 2000-024658

(51) Int. Cl.⁷ ................................................. B05G 3/02
(52) U.S. Cl. .................................................. 427/385.5
(58) Field of Search ...................................... 427/385.5

(56) References Cited

U.S. PATENT DOCUMENTS 5,658,994 A * 8/1997 Burgoyne, Jr. et al. ..... 525/390

FOREIGN PATENT DOCUMENTS

| EP | 0 755 957 | 1/1997 |
| EP | 0 861 864 | 9/1998 |
| EP | 0 875 906 | 11/1998 |
| EP | 0 939 096 | 9/1999 |
| WO | WO 99/29761 | 6/1999 |

OTHER PUBLICATIONS

Patent Abstracts of Japan, vol. 2000, No. 01, Jan. 31, 2000, JP 11 292968, Oct. 26, 1999.
Patent Abstracts of Japan, vol. 1998, No. 11, Sep. 30, 1998, JP 10 152559, Jun. 9, 1998.
Patent Abstracts of Japan, vol. 1998, No. 09, Jul. 31, 1998, JP 10 087816, Apr. 7, 1998.

* cited by examiner

Primary Examiner—Erma Cameron
(74) Attorney, Agent, or Firm—Oblon, Spivak, McClelland, Maier & Neustadt, P.C.

(57) ABSTRACT

A composition for film formation comprising a polymer having repeating structural units represented by the formula (1), the structural unit having one or more alkyl groups therein, and an insulating film obtained by applying the composition for film formation to a substrate and heating the coating film.

6 Claims, No Drawings

COMPOSITION FOR FILM FORMATION AND INSULATING FILM

FIELD OF THE INVENTION

The present invention relates to a composition for film formation which contains a poly (arylene ether) polymer soluble in organic solvents and excellent in heat resistance, low dielectric characteristics, and cracking resistance. The invention further relates to an insulating film formed from the composition.

DESCRIPTION OF THE RELATED ART

In the field of electronic materials, the recent progress toward a higher degree of integration, larger number of functions, and higher performances has resulted in increased circuit resistance and increased capacitance between circuits and this in turn has resulted in increases not only in power consumption but in delay time. The increase in delay time is a major factor contributing to a decrease in signal transfer speed in devices and to cross talks. Because of this, it is desired to reduce parasitic resistance or parasitic capacitance. One measure which is being taken in reducing the parasitic capacitance so as to cope with higher-speed device operation is to coat the periphery of a circuit with a low-dielectric interlayer insulating film. For use in LCDs and related products, such insulating films may be required to have transparency besides low-dielectric characteristics.

Polyimides are widely known as a heat-resistant organic material which meets those requirements. However, since polyimides contain imide groups, which are highly polar, they not only are insufficient in low-dielectric characteristics and low water absorption but have a problem that they have a color. No satisfactory polyimides have been obtained.

On the other hand, polyphenylenes are known as an organic material having high heat resistance and containing no polar groups. Since these polyphenylenes have poor solubility in organic solvents although excellent in heat resistance, soluble groups are generally incorporated into side chains. Examples of such polyphenylenes include the polymers disclosed in U.S. Pat. No. 5,214,044, WO 96/28491, and EP 629217.

These polymers basically have a poly-p-phenylene structure as the main structure. Although the structural units of the polymers are partly derived from a flexible monomer used as a comonomer, the polymers are soluble in specific organic solvents only and have a problem that solutions thereof have a high viscosity due to the stiffness of the molecules. Those polyphenylenes are by no means satisfactory in processability.

Investigations have been made on the crosslinking of a polyphenylene polymer for the purposes of impartation of solvent resistance, improvement of physical heat resistance and mechanical properties, etc., and a crosslinking reaction utilizing an acetylene bond has been known. However, this conventional technique has problems that there are limitations on polyphenylene (polyarylene) structures into which the crosslink structure can be incorporated and on reactions usable for the crosslinking, and that the processing is unsuitable for general use because a special acetylene compound should be used as a starting material and a high temperature is necessary for curing.

Furthermore, a technique for enhancing the processability and solubility of a polyarylene by incorporating ether bonds into the polymer has been investigated. However, the polymer thus obtained has insufficient heat resistance.

As described above, there have been few polymer techniques which are widely applicable simple processes for imparting curability and are effective in fully satisfying heat resistance, low-dielectric characteristics, and processability and in improving solvent resistance, physical heat resistance, and mechanical properties.

SUMMARY OF THE INVENTION

One object of the invention is to provide a composition for film formation containing a heat-curable poly(arylene ether) polymer which is excellent in heat resistance, low-dielectric characteristics, and cracking resistance and is capable of being improved in solvent resistance, physical heat resistance, and mechanical properties.

Another object of the invention is to provide an insulating film formed from the composition.

The invention provides a composition for film formation containing a polymer made up of repeating structural units which comprise units represented by the following formula (1) and have one or more alkyl groups therein (hereinafter, this polymer is often referred to as "poly(arylene ether)"):

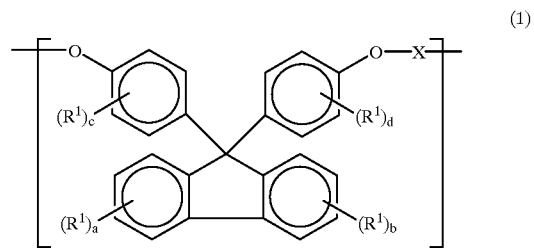
(1)

wherein $R^1$'s are the same or different and each represents an alkyl group; a to d are the same or different and each is an integer of 0 to 4; and X represents a divalent organic group having one to three aromatic rings.

In formula (1), X is preferably at least one group selected from groups (A) to (L) represented by the following formulae (2):

(A)

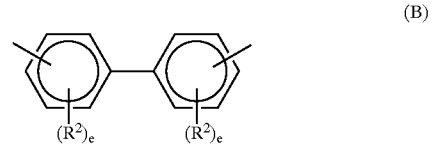
(B)

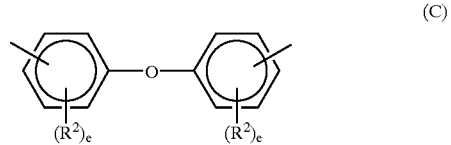
(C)

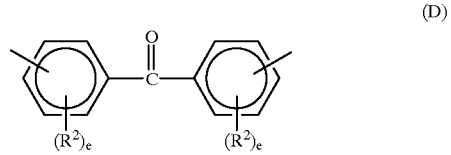
(D)

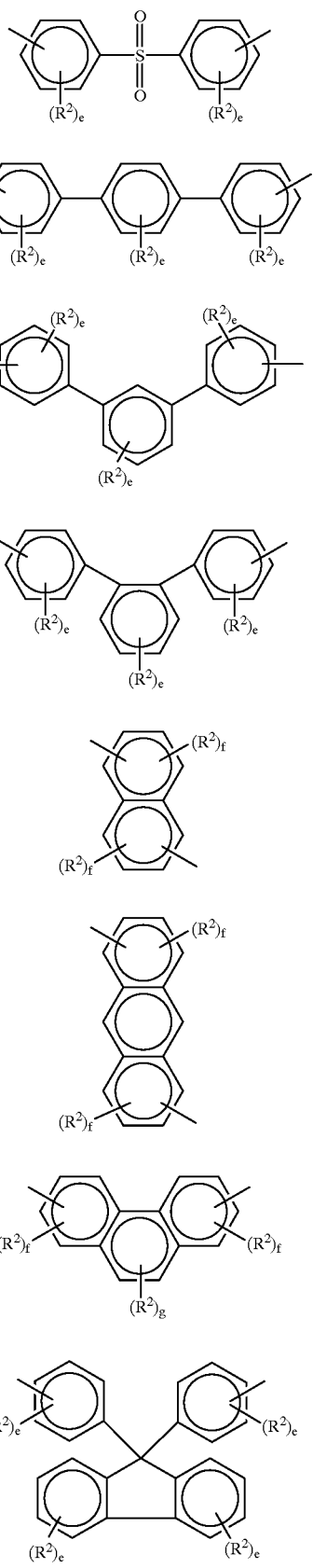

(E)
(F)
(G)
(H)
(I)
(J)
(K)
(L)

wherein $R^2$'s are the same or different and each represents an alkyl group; e's are the same or different and each is an integer of 0 to 4; f's are the same or different and each is an integer of 0 to 3; and g's are the same or different and each is an integer of 0 to 2.

Each formula (2), representing X, preferably is a group having one or more alkyl groups.

Furthermore, the poly(arylene ether) preferably contains both at least one unit wherein X is a group represented by a formula (2) having one or more alkyl groups and at least one unit wherein X is a group represented by a formula (2) having no alkyl groups.

The invention further provides an insulating film material formed from the composition for film formation.

DETAILED DESCRIPTION OF THE INVENTION

The composition for film formation of the invention contains a polymer comprising repeating structural units represented by formula (1) in an amount of generally 50% by mole or larger, preferably 70% by mole or larger. If the proportion of the units is lower than 50% by mole, the composition for film formation gives a film having poor heat resistance.

The poly(arylene ether) for use in the invention is a polymer formed by copolymerizing a compound having a fluorene framework with a compound having an aromatic ring framework so as to have repeating structural units represented by formula (1), and has one or more alkyl groups incorporated somewhere therein. These alkyl groups participate in the crosslinking of the polymer and thereby improve heat resistance and strength.

Namely, in the poly(arylene ether) for use in the invention, there are no particular limitations on the position of each alkyl group incorporated therein and the alkyl group may be present somewhere in the molecular chain. For example, the poly(arylene ether) may be one which comprises repeating structural units represented by formula (1) wherein (a+b+c+d) is 1 or larger.

In the case where X in formula (1) is represented by formulae (2), the repeating structural units may be composed of ones in which X is represented by a formula (2) wherein e to g each is 0 and ones in which X is represented by a formula (2) wherein e to g each exceeds 1. Namely, the polymer may be one in which X is represented by formulae (2) wherein the average of e to g exceeds 1.

In short, as long as one or more alkyl groups have been incorporated somewhere in the poly(arylene ether) for use in the invention, these alkyl groups participate in the crosslinking of the polymer to give an insulating film material having improved heat resistance and strength.

The poly(arylene ether) especially preferably has units represented by formula (1) wherein a+b+c+d is 1 or larger and further has units represented by formula (1) wherein a+b+c+d is 0.

Examples of the alkyl groups represented by $R^1$ and $R^2$ in formulae (1) and (2) include alkyl groups having 1 to 4 carbon atoms, such as methyl, ethyl, propyl, and n-butyl.

The poly (arylene ether) to be used in the invention can be obtained, for example, by the coupling reaction of an alkali metal salt of a bisphenol compound with a dihalogenated compound.

Examples of the bisphenol compound include 9,9-bis(4-hydroxyphenyl)fluorene, 9,9-bis(4-hydroxy-3-methylphenyl)fluorene, 9,9-bis(4-hydroxy-3-ethylphenyl)

fluorene, 9,9-bis(4-hydroxy-3-propylphenyl)fluorene, 9,9-bis(4-hydroxy-3-butylphenyl)fluorene, 9,9-bis(4-hydroxy-3,5-dimethylphenyl)fluorene, 9,9-bis (4-hydroxy-3,5-diethylphenyl)fluorene, 9,9-bis (4-hydroxy-3,5-dipropylphenyl)fluorene, 9,9-bis(4-hydroxy-3,5-dibutylphenyl)fluorene, 9,9-bis(4-hydroxyphenyl)-3,6-dimethylfluorene, 9,9-bis(4-hydroxyphenyl)-4,5-dimethylfluorene, hydroquinone, methylhydroquinone, ethylhydroquinone, 2,2'-biphenol, 4,4'-biphenol, 3,3'-dimethyl-4,4'-dihydroxybiphenyl, bis (2-hydroxyphenyl) ether, bis(4-hydroxyphenyl) ether, bis(4-hydroxy-3-methylphenyl) ether, bis(2-hydroxyphenyl) ketone, bis(4-hydroxyphenyl) ketone, bis(4-hydroxy-3-methylphenyl) ketone, bis(4-hydroxyphenyl) sulfone, bis(4-hydroxy-3-methylphenyl) sulfone, 4,4"-dihydroxy-p-terphenyl, 4,4"-dihydroxy-m-terphenyl, 4,4"-dihydroxy-o-terphenyl, 1,4-dihydroxynaphthalene, 1,6-dihydroxynaphthalene, 1,7-dihydroxynaphthalene, 2,6-dihydroxynaphthalene, 2,7-dihydroxynaphthalene, 2,7-dihydroxyphenanthrene, and 3,6-dihydroxyphenanthrene.

Preferred of those are 9,9-bis(4-hydroxyphenyl), fluorene, 9,9-bis(4-hydroxy-3-methylphenyl)fluorene, 9,9-bis(4-hydroxy-3-ethylphenyl)fluorene, 9,9-bis(4-hydroxy-3-propylphenyl)fluorene, 9,9-bis(4-hydroxy-3-butylphenyl)fluorene, hydroquinone, methylhydroquinone, 4,4'-biphenol, bis(4-hydroxyphenyl) ether, bis(4-hydroxyphenyl) ketone, bis(4-hydroxyphenyl) sulfone, 4,4"-dihydroxy-p-terphenyl, 4,4"-dihydroxy-m-terphenyl, 1,6-dihydroxynaphthalene, and 1,7-dihydroxynaphthalene.

Especially preferred bisphenol compounds having one or more alkyl groups include 9,9-bis(4-hydroxy-3-methylphenyl)fluorene, 9,9-bis(4-hydroxy-3-ethylphenyl)fluorene, 9,9-bis(4-hydroxy-3-propylphenyl)fluorene, 9,9-bis(4-hydroxy-3-butylphenyl)fluorene, and methylhydroquinone.

Those bisphenol compounds may be used alone or in combination of two or more thereof.

Examples of the dihalogenated compound include 9,9-bis(4-chlorophenyl)fluorene, 9,9-bis(4-chloro-3-methylphenyl)fluorene, 9,9-bis(4-chloro-3-ethylphenyl)fluorene, 9,9-bis(4-chloro-3-propylphenyl)fluorene, 9,9-bis(4-chloro-3-butylphenyl)fluorene, 9,9-bis(4-bromophenyl)fluorene, 9,9-bis(4-fluorophenyl)fluorene, 9,9-bis(4-chlorophenyl)-3,6-dimethylfluorene, 9,9-bis(4-chlorophenyl)-4,5-dimethylfluorene, 1,3-dichlorobenzene, 1,3-dibromobenzene, 1,3-diiodobenzene, 1,3-difluorobenzene, 1,4-dichlorobenzene, 1,4-dibromobenzene, 1,4-diiodobenzene, 1,4-difluorobenzene, 2,4-dichlorotoluene, 2,5-dichlorotoluene, 2,4-dibromotoluene, 2,5-dibromotoluene, 2,4-diiodotoluene, 2,5-diiodotoluene, 2,4-difluorotoluene, 2,5-difluorotoluene, 3,3'-dichlorobiphenyl, 4,4'-dichlorobiphenyl, 3,3'-dibromobiphenyl, 4,4'-dibromobiphenyl, 3,3'-diiodobiphenyl, 4,4'-diiodobiphenyl, 3,3'-difluorobiphenyl, 4,4'-difluorobiphenyl, 3,3'-dimethyl-4,4'-dichlorobiphenyl, bis(4-chlorophenyl) ether, bis(4-bromophenyl) ether, bis(4-iodophenyl) ether, bis(4-fluorophenyl) ether, bis(2-chlorophenyl) ketone, bis(2-bromophenyl) ketone, bis(2-iodophenyl) ketone, bis(2-fluorophenyl) ketone, bis(4-chlorophenyl) ketone, bis(4-bromophenyl) ketone, bis(4-iodophenyl) ketone, bis(4-fluorophenyl) ketone, bis(2-chlorophenyl) sulfone, bis(2-bromophenyl) sulfone, bis(2-iodophenyl) sulfone, bis(2-fluorophenyl)sulfone, bis(4-chlorophenyl) sulfone, bis(4-bromophenyl) sulfone, bis(4-iodophenyl) sulfone, bis(4-fluorophenyl) sulfone, 4,4'-dichloro-p-terphenyl, 4,4'-dibromo-p-terphenyl, 4,4'-diiodo-p-terphenyl, 4,4'-difluoro-p-terphenyl, 4,4'-dichloro-m-terphenyl, 4,4'-dibromo-m-terphenyl, 4,4'-diiodo-m-terphenyl, 4,4'-difluoro-m-terphenyl, 4,4'-dichloro-o-terphenyl, 4,4'-dibromo-o-terphenyl, 4,4'-diiodo-o-terphenyl, 4,4'-difluoro-o-terphenyl, 1,4-dichloronaphthalene, 1,4-dibromonaphthalene, 1,4-diiodonaphthalene, 1,4-difluoronaphthalene, 1,6-dichloronaphthalene, 1,6-dibromonaphthalene, 1,6-diiodonaphthalene, 1,6-difluoronaphthalene, 1,7-dichloronaphthalene, 1,7-dibromonaphthalene, 1,7-diiodonaphthalene, 1,7-difluoronaphthalene, 2,6-dichloronaphthalene, 2,6-dibromonaphthalene, 2,6-diiodonaphthalene, 2,6-difluoronaphthalene, 2,7-dichloronaphthalene, 2,7-dibromonaphthalene, 2,7-diiodonaphthalene, 2,7-difluoronaphthalene, 9,10-dichloroanthracene, 9,10-dibromoanthracene, 9,10-diiodoanthracene, 9,10-difluoroanthracene, 2,7-dichlorophenanthrene, and 3,6-dichlorophenanthrene.

Preferred of those are 9,9-bis(4-chlorophenyl)fluorene, 9,9-bis(4-chloro-3-methylphenyl)fluorene, 9,9-bis(4-chloro-3-ethylphenyl)fluorene, 9,9-bis(4-chloro-3-propylphenyl)fluorene, 9,9-bis(4-chloro-3-butylphenyl)fluorene, 1,3-dichlorobenzene, 1,3-dibromobenzene, 1,3-diiodobenzene, 1,3-difluorobenzene, 1,4-dichlorobenzene, 1,4-dibromobenzene, 1,4-diiodobenzene, 1,4-difluorobenzene, 2,4-dichlorotoluene, 2,5-dichlorotoluene, 2,4-dibromotoluene, 2,5-dibromotoluene, 2,4-diiodotoluene, 2,5-diiodotoluene, 2,4-difluorotoluene, 2,5-difluorotoluene, 3,3'-dichlorobiphenyl, 4,4'-dichlorobiphenyl, 3,3'-dibromobiphenyl, 4,4'-dibromobiphenyl, 3,3'-diiodobiphenyl, 4,4'-diiodobiphenyl, bis(4-chlorophenyl) ether, bis(4-bromophenyl) ether, bis(4-chlorophenyl) ketone, bis(4-fluorophenyl) ether, bis(4-bromophenyl) ketone, bis(4-fluorophenyl) ketone, bis(4-chlorophenyl) sulfone, bis(4-bromophenyl) sulfone, 4,4'-dichloro-p-terphenyl, 4,4'-dibromo-p-terphenyl, 4,4'-dichloro-m-terphenyl, 4,4'-dibromo-m-terphenyl, 1,4-dichloronaphthalene, 1,4-dibromonaphthalene, and 9,10-dichloroanthracene.

Especially preferred dihalogenated compounds having one or more alkyl groups include 2,4-dichlorotoluene, 2,5-dichlorotoluene, 2,4-dibromotoluene, 2,5-dibromotoluene, 2,4-diiodotoluene, 2,5-diiodotoluene, 2,4-difluorotoluene, and 2,5-difluorotoluene.

Those dihalogenated compounds may be used alone or in combination of two or more thereof.

The bisphenol compound and the dihalogenated compound are used in such a ratio that the proportion of the bisphenol compound is generally from 30 to 60% by mole, preferably from 45 to 55% by mole, and that of the dihalogenated compound is generally from 70 to 40% by mole, preferably from 55 to 45% by mole, based on the sum of the bisphenol compound and the dihalogenated compound. If the proportion of the bisphenol compound used is lower than 30% by mole or exceeds 60% by mole, a polymer having a sufficiently high molecular weight is difficult to obtain and there are cases where the resultant composition has poor applicability in coating film formation.

A method usable for synthesizing the poly(arylene ether) for use in the invention comprises heating the bisphenol compound and the dihalogenated compound in a solvent in the presence of a catalyst such as, e.g., an alkali metal compound.

Examples of the alkali metal compound for use in the synthesis include sodium hydroxide, potassium hydroxide, lithium hydroxide, sodium carbonate, potassium carbonate, lithium carbonate, sodium hydrogen carbonate, potassium hydrogen carbonate, lithium hydrogen carbonate, sodium hydride, potassium hydride, lithium hydride, sodium metal, potassium metal, and lithium metal.

Those alkali metal compounds may be used alone or in combination of two or more thereof.

The alkali metal compound may be used in an amount of generally from 200 to 800% by mole, preferably from 200 to 500% by mole, based on the bisphenol compound.

A promoter may be used for accelerating the reaction. Examples thereof include copper metal, cuprous chloride, cupric chloride, cuprous bromide, cupric bromide, cuprous iodide, cupric iodide, cuprous sulfate, cupric sulfate, cuprous acetate, cupric acetate, cuprous formate, and cupric formate.

This promoter may be used in an amount of generally from 1 to 50% by mole, preferably from 1 to 30% by mole, based on the bisphenol compound.

Examples of the solvent for use in the reaction include pyridine, quinoline, benzophenone, diphenyl ether, dialkoxybenzenes (each alkoxyl group has 1 to 4 carbon atoms) trialkoxybenzenes (each alkoxyl group has 1 to 4 carbon atoms), diphenyl sulfone, dimethyl sulfoxide, dimethyl sulfone, diethyl sulfoxide, diethyl sulfone, diisopropyl sulfone, tetrahydrofuran, tetrahydrothiophene, sulfolane, N-methyl-2-pyrrolidone, N-ethyl-2-pyrrolidone, dimethylimidazolidinone, γ-butyrolactone, dimethylformamide, and dimethylacetamide.

Those solvents may be used alone or in combination of two or more thereof.

In synthesizing the poly(arylene ether), the monomer concentration in the solvent used in the reaction is generally from 2 to 50% by weight based on the monomers and the reaction temperature is generally from 50 to 250° C.

The reaction mixture obtained after the poly(arylene ether) synthesis is preferably filtered and subjected to reprecipitation with a poor solvent for the poly (arylene ether), in order to remove the metal salt resulting from the synthesis and the monomers remaining unreacted.

The poly(arylene ether) thus obtained has a weight-average molecular weight as determined by GPC of generally from 500 to 100,000, preferably from 1,000 to 100,000.

The composition for film formation of the invention is produced by dissolving the poly(arylene ether) in an organic solvent.

Examples of the organic solvent for use in the invention include:

aliphatic hydrocarbon solvents such as n-pentane, isopentane, n-hexane, isohexane, n-heptane, isoheptane, 2,2,4-trimethylpentane, n-octane, isooctane, cyclohexane, and methyl cyclohexane;

aromatic hydrocarbon solvents such as benzene, toluene, xylene, ethylbenzene, trimethylbenzene, methyl ethylbenzene, n-propylbenzene, isopropylbenzene, diethylbenzene, isobutylbenzene, triethylbenzene, diisopropylbenzene, n-amylnaphthalene, and trimethylbenzene;

monohydric alcohol solvents such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol;

polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol;

ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclopenanone, cyclohexanone, 2-hexanone, methylcyclohexanone, 2,4-pentanedione, acetonylacetone, diacetone alcohol, acetophenone, and fenchone;

ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran;

ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetates, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethylmalonate, dimethylphthalate, and diethyl phthalate;

nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone.

Those organic solvents can be used alone or as a mixture of two or more thereof.

Other Additives

Ingredients such as, e.g., a crosslinking agent, coupling agent, complexing compound, and organic polymer may be added to the composition for film formation obtained according to the invention.

Crosslinking Agent

Examples of the crosslinking agent include organic peroxides, compounds represented by the formula (3) which will be given later, compounds having one or more polymerizable double bonds, and compounds having one or more polymerizable triple bonds.

Examples of the organic peroxides include isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexyl peroxydicarbonate, t-hexyl peroxyneodecanoate, dimethoxybutyl peroxydicarbonate, di (3-methyl-3-methoxybutyl) peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis (t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy) hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy) hexane, t-butyl peroxyacetate, 2,2-bis(t-butylperoxy)butane, t-butyl peroxybenzoate, n-butyl 4,4-bis(t-butylperoxy) valerate, di-t-butyl peroxyisophthalate, α,α'-bis (t-butylperoxy)diisopropylbenzene, dicumyl peroxide, 2,5-dimethyl-2,5-di(t-butylperoxy) hexane, t-butylcumyl peroxide, di-t-butyl peroxide, p-menthane hydroperoxide, 2,5-dimethyl-2,5-di(t-butylperoxy)hexyne-3, diisopropyl-benzene hydroperoxide, t-butyl trimethylsilyl peroxide, 1,1, 3,3-tetramethylbutyl hydroperoxide, cumene hydroperoxide, t-hexyl hydroperoxide, and t-butyl hydroperoxide.

Those peroxides may be used alone or in combination of two or more thereof.

(3)

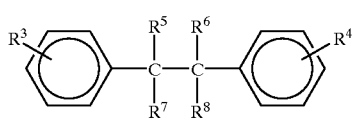

On the other hand, in the compounds represented by formula (3), $R^3$ to $R^8$ each independently represents a hydrogen atom, a hydrocarbon group having 1 to 20 carbon atoms, cyano, nitro, an alkoxyl group having 1 to 20 carbon atoms, or a halogen atom.

Examples of the compounds represented by formula (3) include dibenzyl, 2,3-dimethyl-2,3-diphenylbutane, α,α'-dimethoxy-α,α'-diphenylbibenzyl, α,α'-diphenyl-α-methoxybibenzyl, α,α'-diphenyl-α,α'-dimethoxybibenzyl, α,α'-dimethoxy-α,α'-dimethylbibenzyl, α,α'-dimethoxybibenzyl, 3,4-dimethyl-3,4,-diphenyl-n-hexane, and 2,2,3,3-tetraphenylsuccinonitrile. Preferred of these are dibenzyl and 2,3-dimethyl-2,3-diphenylbutane.

Those compounds represented by formula (3) may be used alone or in combination of two or more thereof.

Examples of the compounds having one or more polymerizable double bonds include:

allyl compounds such as allylbenzene, diallylbenzene, triallylbenzene, allyloxybenzene, diallyloxybenzene, triallyloxybenzene, α,α'-diallyloxyalkanes, α,α'-diallylalkenes, α,α'-diallylalkynes, allylamine, diallylamine, triallylamine, N-allylphthalimide, N-allylpyromellitimide, N,N'-diallylurea, triallyl isocyanurate, and 2,2'-diallylbisphenol A;

vinyl compounds such as styrene, divinylbenzene, trivinylbenzene, stilbene, propenylbenzene, dipropenylbenzene, tripropenylbenzene, phenyl vinyl ketone, methyl styryl ketone, α,α'-divinylalkanes, α,α'-divinylalkenes, α,α'-divinylalkynes, α,α'-divinyloxyalkanes, α,α'-divinylalkenes, α,α'-divinylalkynes, α,α'-diacryloyloxyalkanes, α,α'-diacryloylalkenes, α,α'-diacryloylalkynes, α,α'-dimethacryloyloxyalkanes, α,α'-dimethacryloylalkenes, α,α'-dimethacryloylalkynes, bisacryloyloxybenzene, trisacryloyloxybenzene, bismethacryloyloxybenzene, trismethacryloyloxybenzene, N-vinylphthalimide, and N-vinylpyromellitimide; and polyarylene ethers containing 2,2'-diallyl-4,4'-biphenol and polyarylenes containing 2,2'-diallyl-4,4'-biphenol.

Those compounds having one or more polymerizable double bonds may be used alone or in combination of two or more thereof.

Examples of the compounds having one or more polymerizable triple bonds include compounds represented by the following formula (6) and compounds represented by the following formula (7):

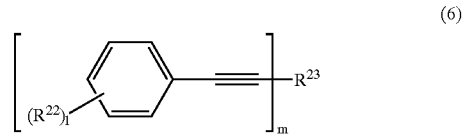

(6)

(7)

wherein $R^{23}$ represents an aromatic group having a valence of from 2 to m; $R^{24}$ represents an aromatic group having a valence of from 2 to n; $R^{22}$ represents an alkyl group having 1 to 3 carbon atoms; l is an integer of 0 to 5; and m and n each independently is an integer of 2 to 6.

Examples of $R^{22}$ in formula (6), which is an alkyl group having 1 to 3 carbon atoms, include methyl, ethyl, n-propyl, and isopropyl. Examples of R in formula (6), which is an aromatic group having a valence of from 2 to m, and examples of $R^{24}$ in formula (7), which is an aromatic group having a valence of from 2 to n, include groups represented by the following formulae:

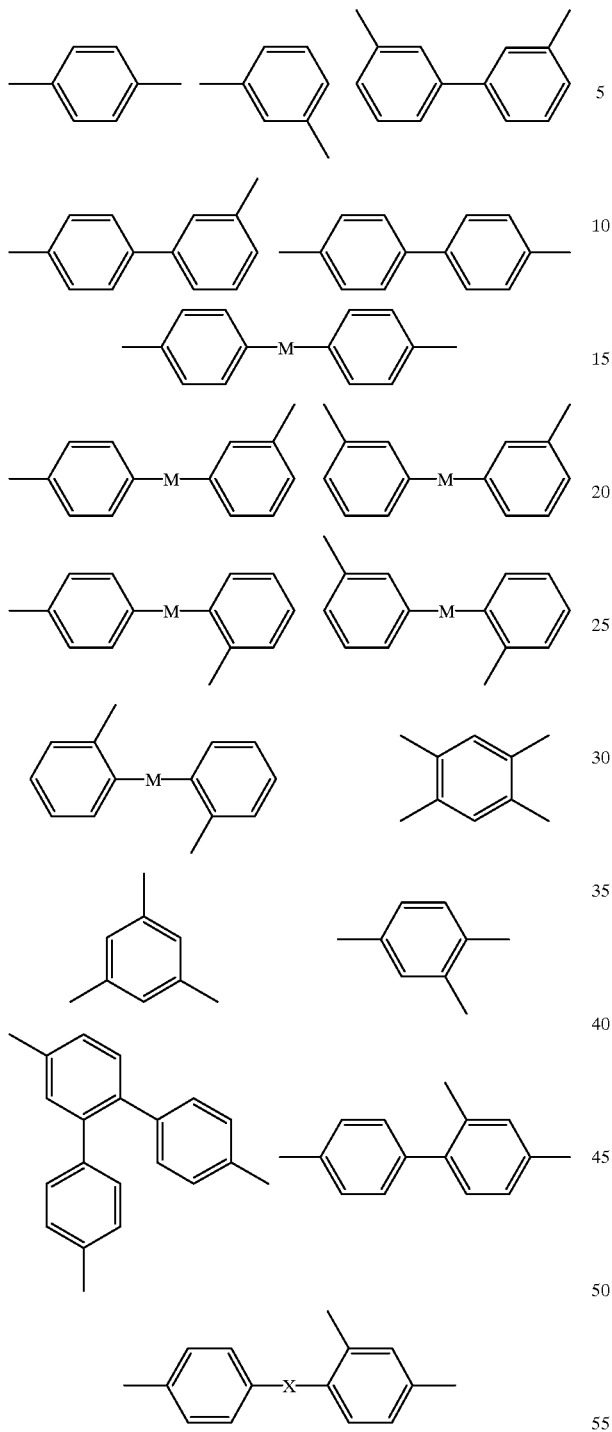
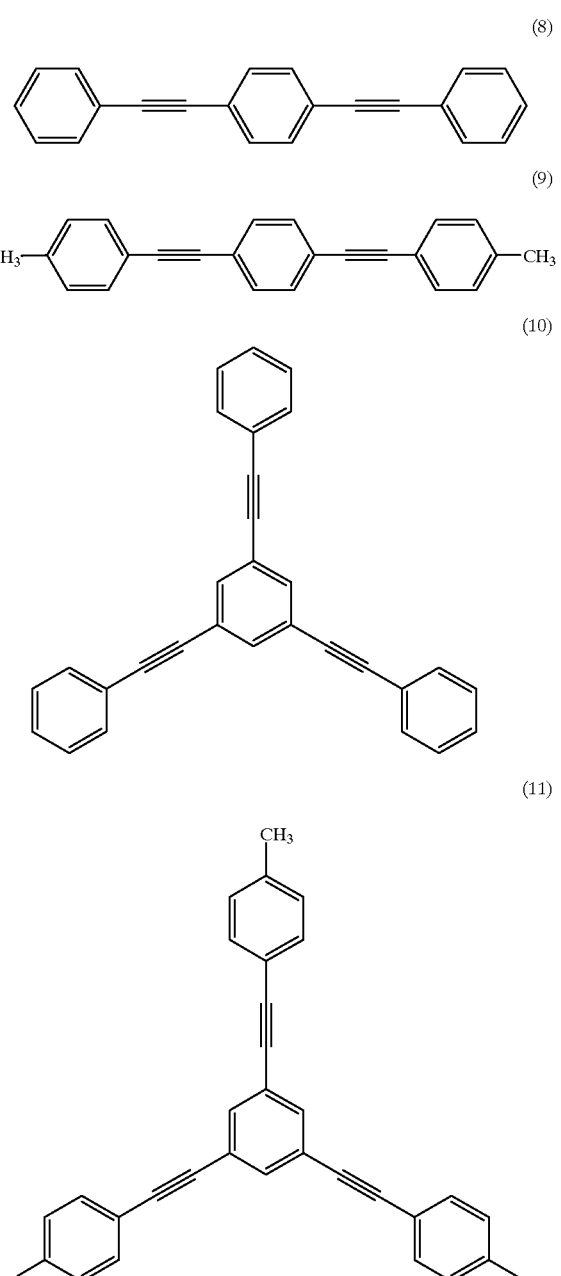
wherein M represents at least one member selected from —O—, —S—, —CH$_2$—, —C(CH$_3$)$_2$—, and fluorenyl.
Specific examples of the compound represented by formula (6) include the following compounds (8) to (19).

(12)
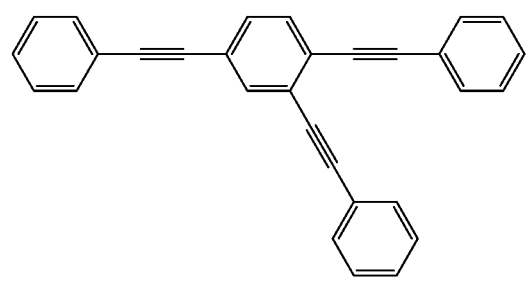
(13)
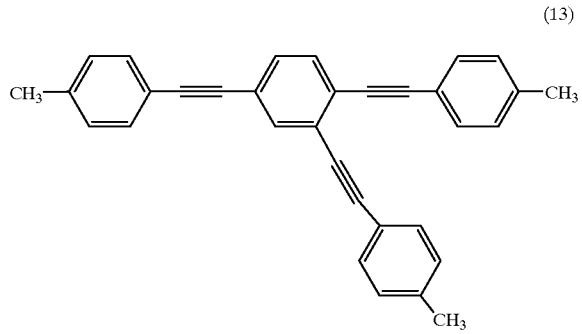
(14)
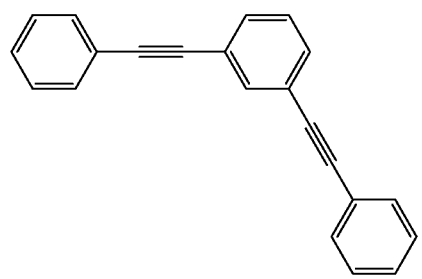
(15)
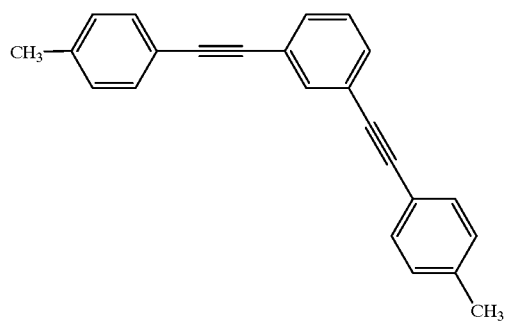
(16)
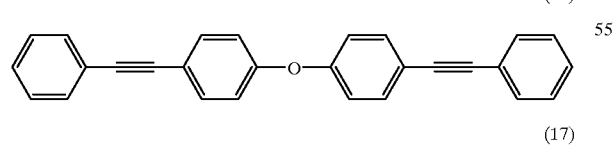
(17)
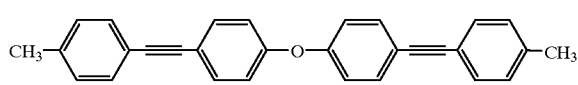
(18)
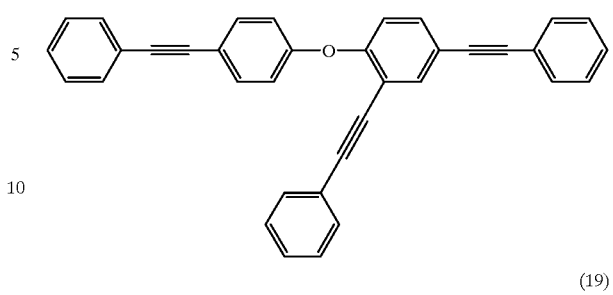
(19)
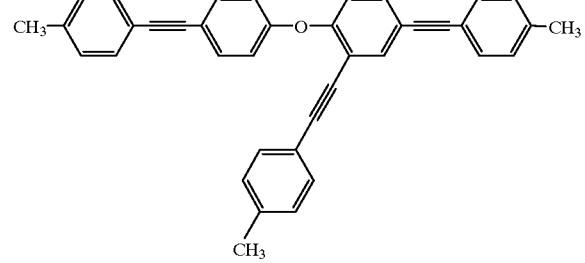
Specific examples of the ingredient (B) represented by formula (7) include the following compounds (20) to (25).
(20)
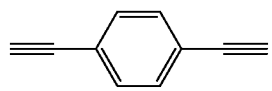
(21)
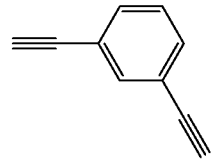
(22)
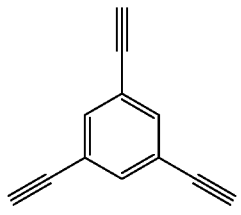
(23)
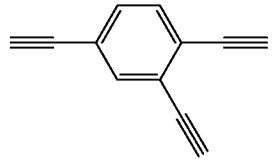
(24)
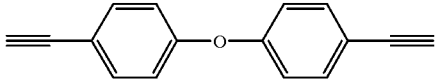

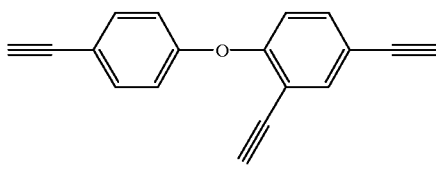
(25)

Other examples of the compounds having one or more polymerizable triple bonds include ethynylbenzene, bis(trimethylsilylethynyl)benzene, tris(trimethylsilylethynyl)benzene, tris(trimethylsilylethynyl)benzene, bis(trimethylsilylethynylphenyl) ether, and trimethylsilylethynylbenzene.

Those compounds having one or more polymerizable triple bonds may be used alone or in combination of two or more thereof.

Coupling Agent

As the coupling agent can be used a silane coupling agent having reactive groups, a combination of a hydrolyzate and condensate thereof, or either of the hydrolyzate and condensate.

The silane coupling agent having reactive groups is, for example, at least one member selected from the group consisting of (1) alkoxysilane compounds having at least one reactive double-bond group or at least one reactive triple-bond group or both in the molecule, (2) acetoxysilane compounds having at least one reactive double-bond group or at least one reactive triple-bond group or both in the molecule, (3) alkoxysilane compounds having a tolyl group in the molecule, and (4) acetoxysilane compounds having a tolyl group in the molecule.

Specific examples of the silane coupling agent having reactive groups include vinyltrimethoxysilane, vinyltriethoxysilane, vinyltri-n-propoxysilane, vinyltriisopropoxysilane, vinyltri-n-butoxysilane, vinyltriisobutoxysilane, vinyltri-sec-butoxysilane, vinyl tri-t-butoxysi lane, divinyldimethoxysilane, divinyldiethoxysilane, divinyldi-n-propoxysilane, divinyldiisopropoxysilane, divinyldi-n-butoxysilane, divinyldiisobutoxysilane, divinyldi-sec-butoxysilane, divinyldi-t-butoxysilane, trivinylmethoxysilane, trivinylethoxysilane, trivinyl-n-propoxysilane, trivinylisopropoxysilane, trivinyl-n-butoxysilane, trivinylisobutoxysilane, trivinyl-sec-butoxysilane, trivinyl-t-butoxysilane, vinyltris(2-methoxyethoxy)silane, divinylbis(2-methoxyethoxy)silane, trivinyl(2-methoxyethoxy)silane;

vinylmethyldimethoxysilane, vinylmethyldiethoxysilane, vinylethyldimethoxysilane, vinylethyldiethoxysilane, vinylphenyldimethoxysilane, vinylphenyldiethoxysilane, divinylmethylmethoxysilane, divinylmethylethoxysilane, divinylethylmethoxysilane, divinylethylethoxysilane, divinylphenylmethoxysilane, divinylphenylethoxysilane;

1,3-divinyltetramethoxysiloxane, 1,3-divinyltetraethoxysiloxane, 1,3-divinyl-1,3-dimethyldimethoxysiloxane, 1,3-divinyl-1,3-dimethyldiethoxysiloxane;

vinyltriacetoxysilane, divinyldiacetoxysilane, trivinylacetoxysilane, vinylmethyldiacetoxysilane, vinylethyldiacetoxysilane, vinylphenyldiacetoxysilane, divinylmethylacetoxysilane, divinylethylacetoxysilane, divinylphenylacetoxysilane, 1,3-divinyltetraacetoxysiloxane, 1,3-divinyl-1,3-dimethyldiacetoxysiloxane;

(3-acryloxypropyl) dimethylmethoxysilane, (3-acryloxypropyl) dimethylethoxysilane, N-3-(acryloxy-2-hydroxypropyl)-3-aminopropyltrimethoxysilane, N-3-(acryloxy-2-hydroxypropyl)-3-aminopropyltriethoxysilan, (3-acryloxypropyl) methyldimethoxysilane, (3-acryloxypropyl) methyldiethoxysilane, (3-acryloxypropyl) trimethoxysilane, (3-acryloxypropyl) triethoxysilane, 3-allylamino)propyltrimethoxysilane, 3-(N-allylamino)propyltriethoxysilane, allyldimethoxysilane, allyldiethoxysilane;

ethynyltrimethoxysilane, ethynyltriethoxysilane, ethynyltri-n-propoxysilane, ethynyltriisopropoxysilane, ethynyltri-n-butoxysilane, ethynyltriisobutoxysilane, ethynyltri-sec-butoxysilane, ethynyltri-t-butoxysilane, diethynyldimethoxysilane, diethynyldiethoxysilane, diethynyldi-n-propoxysilane, diethynyldiisopropoxysilane, diethynyldi-n-butoxysilane, diethynyldiisobutoxysilane, diethynyldi-sec-butoxysilane, diethynyldi-t-butoxysilane, triethynylmethoxysilane, triethynylethoxysilane, triethynyl-n-propoxysilane, triethynylisopropoxysilane, triethynyl-n-butoxysilane, triethynylisobutoxysilane, triethynyl-sec-butoxysilane, triethynyl-t-butoxysilane, ethynyltris(2-methoxyethoxy)silane, diethynylbis(2-methoxyethoxy)silane, triethynyl(2-methoxyethoxy)silane;

ethynylmethyldimethoxysilane, ethynylmethyldiethoxysilane, ethynylethyldimethoxysilane, ethynylethyldiethoxysilane, ethynylphenyldimethoxysilane, ethynylphenyldiethoxysilane, diethynylmethylmethoxysilane, diethynylmethylethoxysilane, diethynylethylmethoxysilane, diethynylethylethoxysilane, diethynylphenylmethoxysilane, diethynylphenylethoxysilane;

1,3-diethynyltetramethoxysiloxane, 1,3-diethynyltetraethoxysiloxane, 1,3-diethynyl-1,3-dimethyldimethoxysiloxane, 1,3-diethynyl-1,3-dimethyldiethoxysiloxane;

ethynyltriacetoxysilane, diethynyldiacetoxysilane, triethynylacetoxysilane, ethynylmethyldiacetoxysilane, ethynylethyldiacetoxysilane, ethynylphenyldiacetoxysilane, diethynylmethylacetoxysilane, diethynylethylacetoxysilane, diethynylphenylacetoxysilane, 1,3-diethynyltetraacetoxysiloxane, 1,3-diethynyl-1,3-dimethyldiacetoxysiloxane;

(phenylethynyl)trimethoxysilane, (phenylethynyl)triethoxysilane, (phenylethynyl)tri-n-propoxysilane, (phenylethynyl)triisopropoxysilane, (phenylethynyl)tri-n-butoxysilane, (phenylethynyl)triisobutoxysilane, (phenylethynyl)tri-sec-butoxysilane, (phenylethynyl)tri-t-butoxysilane, bis(phenylethynyl)dimethoxysilane, bis(phenylethynyl)diethoxysilane, bis(phenylethynyl)di-n-propoxysilane, bis(phenylethynyl)diisopropoxysilane, bis(phenylethynyl)di-n-butoxysilane, bis(phenylethynyl)diisobutoxysilane, bis(phenylethynyl)di-sec-butoxysilane, bis(phenylethynyl)di-t-butoxysilane, tris(phenylethynyl)methoxysilane, tris(phenylethynyl)ethoxysilane, tris(phenylethynyl)-n-propoxysilane, tris(phenylethynyl)isopropoxysilane, tris(phenylethynyl)-n-butoxysilane, tris(phenylethynyl)isobutoxysilane, tris(phenylethynyl)-sec-butoxysilane, tris(phenylethynyl)-t-butoxysilane, (phenylethynyl)tris(2-methoxyethoxy)silane, bis(phenylethynyl)bis(2-methoxyethoxy)silane, tris(phenylethynyl)(2-methoxyethoxy)silane;

(phenylethynyl)methyldimethoxysilane, (phenylethynyl)methyldiethoxysilane, (phenylethynyl)ethyldimethoxysilane, (phenylethynylethyl)diethoxysilane, (phenylethynyl)phenyldimethoxysilane, (phenylethynyl)phenyldiethoxysilane, bis(phenylethynyl)methylmethoxysilane, bis(phenylethynyl)methylethoxysilane, bis(phenylethynyl)ethylmethoxysilane, bis(phenylethynyl)ethylethoxysilane, bis(phenylethynyl) phenylmethoxysilane, bis(phenylethynyl) phenylethoxysilane;

1,3-bis(phenylethynyl)tetramethoxysiloxane, 1,3-bis(phenylethynyl)tetraethoxysiloxane, 1,3-bis(phenylethynyl)-1,3-dimethyldimethoxysiloxane, 1,3-bis(phenylethynyl)-1,3-dimethyldiethoxysiloxane;

(phenylethynyl)triacetoxysilane, bis (phenylethynyl)diacetoxysilane, tris(phenylethynyl)acetoxysilane, (phenylethynyl)methyldiacetoxysilane, (phenylethynyl)ethyldiacetoxysilane, (phenylethynyl)phenyldiacetoxysilane, bis(phenylethynyl)methylacetoxysilane, bis(phenylethynyl)ethylacetoxysilane, bis(phenylethynyl)phenylacetoxysilane, 1,3-bis(phenylethynyl)tetraacetoxysiloxane, 1,3-bis(phenylethynyl)-1,3-dimethyl diacetoxysil oxane, bis(trimethoxysilyl)acetylene, bis(triethoxysilyl)acetylene;

p-tolyltrimethoxysilane, p-tolyltriethoxysilane, p-tolyltri-n-propoxysilane, p-tolyltriisopropoxysilane, m-tolyltrimethoxysilane, m-tolyltriethoxysilane, m-tolyltri-n-propoxysilane, m-tolyltriisopropoxysilane;

p-tolyltriacetoxysilane, and m-tolyltriacetoxysilane.

Those silane coupling agents (B) having reactive groups may be used in combination of two or more thereof.

Besides such a silane coupling agent having reactive groups, use may be made of both a hydrolyzate of any of those silane coupling agents and a condensate thereof or of either the hydrolyzate or the condensate (hereinafter, these products are inclusively referred to as "product of hydrolysis and condensation").

In hydrolyzing/condensing at least one silane coupling agent selected from the group consisting of the compounds (1) to (4) shown above, it is preferred to use water preferably in an amount larger than 0.5 mol but not larger than 150 mol, more preferably in an amount larger than 0.5 mol but not larger than 130 mol, per mol of the compound(s) (1) to (4).

A catalyst may be used in producing a product of hydrolysis and condensation by hydrolyzing/condensing at least one silane coupling agent selected from the group consisting of the compounds (1) to (4).

In hydrolyzing/condensing a silane coupling agent selected from the compounds (1) to (4), water or solvent-diluted water is added intermittently or continuously, for example, to a solvent containing the silane coupling agent dissolved therein. The catalyst may be added beforehand to the solvent or may be dissolved or disperse in the water prior to the addition of the water. The temperature for this reaction is generally from 0 to 100° C., preferably from 15 to 90° C.

The product of hydrolysis and condensation thus obtained from the silane coupling agent (B) has a weight-average molecular weight, calculated for standard polystyrene, of generally from 300 to 100,000, preferably from 300 to 20,000.

The content of the silane coupling agent in the composition is generally from 0.001 to 10 parts by weight, preferably from 0.005 to 8 parts by weight, per 100 parts by weight of the poly(arylene ether).

Complexing Compound

The complexing compound is a compound having the ability to form a complex with copper. This compound is, for example, at least one member selected from the group consisting of (1) heterocyclic compounds having a five-membered heterocycle and having no framework-forming aromatic rings, (2) heterocyclic compounds having a five-membered heterocycle and a framework-forming aromatic ring, (3) compounds having a six-membered heterocycle containing three nitrogen atoms, (4) bipyridyl compounds, (5) aminophenol compounds, and (6) derivatives of these compounds (1) to (5).

(1) Heterocyclic compounds having five-membered heterocycle and having no framework-forming aromatic rings:

Examples of the heterocyclic compounds having a five-membered heterocycle and having no framework-forming aromatic rings include 7-hydroxy-5-methyl-1,3,4-triazaindolizine, 3H-1,2,3-triazolo[4,5-b]pyridin-3-ol, 1H-tetrazole-1-acetic acid, 1-(2-dimethylaminoethyl)-5-mercaptotetrazole, bismuthiol, 4,5-dicyanoimidazole, adenine, 1-phenyl-5-mercapto-1H-tetrazole, 3-mercapto-1,2,4-triazole, 2-amino-4,5-dicyano-1H-imidazole, 4-amino-1,2,4-triazole, 5-amino-1H-tetrazole, 2-mercaptothiazoline, guanine, 1-phenyl-5-mercapto-1H-tetrazole, 4-amino-3-hydrazino-5-mercapto-1,2,4-triazole, 3-mercapto-4-methyl-4H-1,2,4-triazole, and 1H-tetrazole.

(2) Heterocyclic compounds having five-membered heterocycle and framework-forming aromatic ring:

Examples of the heterocyclic compounds having a five-membered heterocycle and a framework-forming aromatic ring include benzotriazole and derivatives thereof such as 5-methyl-1H-benzotriazole, tolyltriazole, benzimidazole, benzofuroxane, 2,1,3-benzothiadiazole, 2-mercaptobenzothiazole, 2-mercaptobenzothiadiazole, 2-mercaptobenzoxazole, 2-aminobenzothiazole, 2-mercaptobenzothiazole, and 2-amino-6-methylbenzothiazole.

(3) Compounds having six-membered heterocycle containing three nitrogen atoms:

Examples of the compounds having a six-membered heterocycle containing three nitrogen atoms include melamine, 3-amino-5,6-dimethyl-1,2,4-triazine, 2,4-diamino-6-diallylamino-1,3,5-triazine, benzoguanamine, and thiocyanuric acid.

(4) Bipyridyl compounds:

Examples of the bipyridyl compounds include 2,2'-bipyridyl, 2,4'-bipyridyl, 4,4'-bipyridyl, 2,2'-bi-4-picoline, 6,6'-bi-2-picoline, 2,2'-bipyridine-4,4'-dicarboxylic acid, 2,2'-biquinoline, di-2-pyridyl ketone, 1,10-phenanthroline, and 4,7-dimethylphenanthroline.

(5) Aminophenol compounds:

Examples of the aminophenol compounds include 2-aminophenol, 3-aminophenol, 4-aminophenol, 2-amino-4-methylphenol, 2-amino-5-methylphenol, 4-amino-2-methylphenol, 4-amino-3-methylphenol, and 5-amino-2-methylphenol.

(6) Derivatives of compounds (1) to (5) above:

Examples of the derivatives of the compounds (1) to (5) shown above include derivatives formed by substituting the compounds (1) to (5) with at least one substituent selected from alkyl groups having 1 to 4 carbon atoms, halogenoalkyl groups having 1 to 4 carbon atoms, alkoxyl groups having 1 to 4 carbon atoms, halogen atoms, and aryl groups.

Especially preferred among those complexing compounds are the compounds (1) to (3).

The amount of the complexing compound relative to the poly(arylene ether) is generally from 0.001 to 10 parts by weight, preferably from 0.005 to 5 parts by weight, per 100 parts by weight of the poly(arylene ether).

Organic Polymer

Examples of the organic polymer include compounds having a sugar chain structure, vinylamide polymers, (meth)acrylic polymers, aromatic vinyl compounds, dendrimers, polyimides, poly(amic acid), polyarylenes, polyamides, polyquinoxaline, polyoxadiazole, fluoropolymers, and compounds having a poly(alkylene oxide) structure.

Examples of the compounds having a poly (alkylene oxide) structure include compounds having a poly (methylene oxide) structure, poly(ethylene oxide) structure, poly(propylene oxide) structure, poly(tetramethylene oxide) structure, or poly(butylene oxide) structure. Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol/formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfates; and ether-ester type compounds such as polyethylene glycol fatty acid esters, ethylene glycol fatty acid esters, fatty acid monoglycerides, polyglycerol fatty acid esters, sorbi tan fatty acid esters, propylene glycol fatty acid esters, and sucrose fatty acid esters.

Examples of the polyoxyethylene/polyoxypropylene block copolymers include compounds having a block structure represented by either of the following formulae:

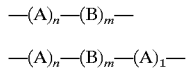

wherein A is the group represented by —$CH_2CH_2O$—; B is the group represented by —$CH_2$—$CH(CH_3)O$—; n is a number of 1 to 90; m is a number of 10 to 99; and 1 is a number of 0 to 90.

Preferred of those polymers are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those polymers may be used alone or in combination of two or more thereof.

The composition for film formation of the invention preferably has a total solid concentration of from 2 to 30% by weight. The total solid concentration thereof is suitably regulated according to purposes of the use thereof. When the composition has a total solid concentration of from 2 to 30% by weight, it not only gives a coating film having an appropriate thickness but has better storage stability.

For applying the composition for film formation of the invention to a substrate such as a silicon wafer, $SiO_2$ wafer, or SiN wafer, use may be made of a coating technique such as spin coating, dip coating, roll coating, or spraying.

This coating operation can be conducted so as to form a coating film having a thickness on a dry basis of about from 0.05 to 1.5 μm in the case of single coating or about from 0.1 to 3 μm in the case of double coating. Thereafter, the wet coating film may be dried at ordinary temperature or dried with heating at a temperature of about from 80 to 600° C. usually for about from 5 to 240 minutes.

In this operation, heating can be conducted with a hot plate, oven, furnace, or the like, for example, in the air, in a nitrogen or argon atmosphere, under vacuum, or under reduced pressure having a controlled oxygen concentration.

The interlayer insulating film (insulating film material) thus obtained is excellent in insulating properties, fastness, dielectric characteristics, and cracking resistance. Consequently, this coating film is useful in applications such as interlayer insulating films for semiconductor devices such as LSIs, system LSIs, DRAMs, SDRAMs, RDRAMs, and D-RDRAMs, etching stoppers for such interlayer insulating films, protective films such as surface coat films for semiconductor devices, interlayers for use in semiconductor production processes employing a multilayered resist, interlayer insulating films for multilayered printed circuit boards, and protective or insulating films for liquid-crystal display devices.

The invention will be explained below in more detail by reference to the following Examples.

In the following Examples and Comparative Examples, all "parts" and "percents" are by weight unless otherwise indicated. The compositions for film formation obtained in the Examples and Comparative Examples were evaluated by the following methods.

Weight average molecular weight (Mw)

Measured by gel permeation chromatography (GPC) under the following conditions.

Sample: One gram of a polymer was dissolved in 100 cc of tetrahydrofuran as a solvent to prepare a sample.

Standard polystyrene: Standard polystyrene manufactured by Pressure Chemical, U.S.A. was used.

Apparatus: A high-performance gel permeation chromatograph for high-temperature use (Model 150-C ALC/GPC) manufactured by Waters Inc., U.S.A.

Column: SHODEX A-80M (length, 50 cm), manufactured by Showa Denko K.K.

Measuring temperature: 40° C.

Flow rate: 1 cc/min

Dielectric constant

A composition sample was applied to an 8-inch silicon wafer by spin coating. This coated substrate was dried on a hot plate first at 80° C. for 1 minute and subsequently at 350° C. for 2 minutes, and then burned on a 450° C. hot plate in a nitrogen atmosphere for 5 minutes. Aluminum was vapor-deposited on the resultant coated substrate to produce a substrate for dielectric constant evaluation. The dielectric constant of the coating film was calculated from the value of capacitance determined at 10 kHz with electrodes HP16451B and precision LCR meter HP4284A, both manufactured by Yokogawa-Hewlett-Packerd, Ltd.

Cracking resistance

A composition sample was applied to an 8-inch silicon wafer by spin coating. This coated substrate was dried on a hot plate first at 80° C. for 1 minute and subsequently at 350° C. for 2 minutes, and then burned on a 450° C. hot plate in a nitrogen atmosphere for 5 minutes. This coating operation was conducted so as to result in a final coating film thickness of 5 μm. The film-coated substrate thus obtained was immersed in pure water for 10 minutes, and the appearance of the coating film was examined with a lamp for surface examination having an illuminance of 350,000 lx. Cracking resistance was evaluated based on the following criteria.

○: No cracks were observed on the coating surface.

X: Cracks were observed on the coating surface.

1% Weight decrease temperature (Td1)

A composition sample was applied to an 8-inch silicon wafer by spin coating. This coated substrate was dried on a hot plate first at 80° C. for 1 minute and subsequently at 350° C. for 2 minutes, and then burned on a 450° C. hot plate in a nitrogen atmosphere for 5 minutes. Thereafter, the coating film was peeled from the substrate and examined by the TG method in a nitrogen atmosphere at a heating rate of 10° C./min.

SYNTHESIS EXAMPLE 1

Into a flask were introduced 35.04 g of 9,9-bis(4-hydroxyphenyl) fluorene, 16.00 g of 50% aqueous sodium hydroxide solution, and 100 g of dimethylacetamide. This mixture was heated at 140° C. in a nitrogen atmosphere for 5 hours while removing from the system the water vapor which was generating. To the resultant solution were added 16.03 g of 2,4-dichlorotoluene and 2.2 g of cuprous chloride. This mixture was reacted at 160° C. for 8 hours, subsequently cooled and filtered to remove the insoluble matter therefrom, and then poured into methanol to conduct reprecipitation. This precipitate was sufficiently washed with ion-exchanged water and then dissolved in cyclohexanone. After the insoluble matter was removed, the solution was poured into acetone to conduct reprecipitation. The resultant precipitate was dried in a 60° C. vacuum oven for 24 hours to thereby obtain a polymer (1).

This polymer had a weight-average molecular weight of 2,300.

SYNTHESIS EXAMPLE 2

The same procedure as in Synthesis Example 1 was conducted, except that 25.12 g of 4,4'-dichloro-3,3'-dimethylbiphenyl was used in place of 16.03 g of 2,4-dichlorotoluene. Thus, a polymer (2) was obtained.

This polymer had a weight-average molecular weight of 2,450.

SYNTHESIS EXAMPLE 3

The same procedure as in Synthesis Example 1 was conducted, except that 26.72 g of bis (4-chloro-3-methylphenyl) ether was used in place of 16.03 g of 2,4-dichlorotoluene. Thus, a polymer (3) was obtained.

This polymer had a weight-average molecular weight of 1,750.

SYNTHESIS EXAMPLE 4

The same procedure as in Synthesis Example 1 was conducted, except that 27.92 g of bis (4-chloro-3-methylphenyl) ketone was used in place of 16.03 g of 2,4-dichlorotoluene. Thus, a polymer (4) was obtained.

This polymer had a weight-average molecular weight of 1,950.

SYNTHESIS EXAMPLE 5

The same procedure as in Synthesis Example 1 was conducted, except that 27.92 g of bis (4-chloro-3-methylphenyl) ketone was used in place of 16.03 g of 2,4-dichlorotoluene. Thus, a polymer (5) was obtained.

This polymer had a weight-average molecular weight of 1,850.

SYNTHESIS EXAMPLE 6

The same procedure as in Synthesis Example 1 was conducted, except that 31.52 g of bis (4-chloro-3-methylphenyl) sulfone was used in place of 16.03 g of 2,4-dichlorotoluene. Thus, a polymer (6) was obtained.

This polymer had a weight-average molecular weight of 2,200.

SYNTHESIS EXAMPLE 7

The same procedure as in Synthesis Example 1 was conducted, except that 8.02 g of 2,4-dichlorotoluene and 7.35 g of 1,4-dichlorobenzene were used in place of 16.03 g of 2,4-dichlorotoluene. Thus, a polymer (7) was obtained.

This polymer had a weight-average molecular weight of 1,750.

SYNTHESIS EXAMPLE 8

Into a flask were introduced 37.8 g of 9,9-bis(4-hydroxy-3-methylphenyl)fluorene, 37.8 g of potassium carbonate, and 350 g of dimethylacetamide. This mixture was heated at 150° C. in a nitrogen atmosphere for 2 hours while removing from the system the water vapor which was generating. To the resultant solution was added 21.8 g of bis(4-fluorophenyl) ketone. This mixture was reacted at 165° C. for 10 hours, subsequently cooled and filtered to remove the insoluble matter therefrom, and then poured into methanol to conduct reprecipitation. This precipitate was sufficiently washed with ion-exchanged water and then dissolved in cyclohexanone. After the insoluble matter was removed, the solution was poured into methanol to conduct reprecipitation. The resultant precipitate was dried in a 60° C. vacuum oven for 24 hours to thereby obtain a polymer (8).

This polymer had a weight-average molecular weight of 60,300.

SYNTHESIS EXAMPLE 9

Into a flask were introduced 40.6 g of 9,9-bis(4-hydroxy-3-ethylphenyl) fluorene, 38.8 g of potassium carbonate, and 350 g of dimethylacetamide. This mixture was heated at 150° C. in a nitrogen atmosphere for 2 hours while removing from the system the water vapor which was generating. To the resultant solution was added 21.8 g of bis(4-fluorophenyl) ketone. This mixture was reacted at 165° C. for 10 hours, subsequently cooled and filtered to remove the insoluble matter therefrom, and then poured into methanol to conduct reprecipitation. This precipitate was sufficiently washed with ion-exchanged water and then dissolved in cyclohexanone. After the insoluble matter was removed, the solution was poured into methanol to conduct reprecipitation. The resultant precipitate was dried in a 60° C. vacuum oven for 24 hours to thereby obtain a polymer (9).

This polymer had a weight-average molecular weight of 50,000.

SYNTHESIS EXAMPLE 10

Into a flask were introduced 17.5 g of 9,9-bis(4-hydroxyphenyl)fluorene, 18.9 g of 9,9-bis(4-hydroxy-3-methylphenyl) fluorene, 16.00 g of 50% aqueous sodium hydroxide solution, and 100 g of dimethylacetamide. This mixture was heated at 140° C. in a nitrogen atmosphere for 5 hours while removing from the system the water vapor which was generating. To the resultant solution were added 15.6 g of 4,4'-dibromobiphenyl and 2.2 g of cuprous chloride. This mixture was reacted at 160° C. for 8 hours, subsequently cooled and filtered to remove the insoluble matter therefrom, and then poured into methanol to conduct reprecipitation. This precipitate was sufficiently washed with ion-exchanged water and then dissolved in cyclohexanone. After the insoluble matter was removed, the solution was poured into acetone to conduct reprecipitation. The resultant precipitate was dried in a 60° C. vacuum oven for 24 hours to thereby obtain a polymer (10).

This polymer had a weight-average molecular weight of 10,300.

COMPARATIVE SYNTHESIS EXAMPLE 1

The same procedure as in Synthesis Example 1 was conducted, except that 14.70 g of 1,3-dichlorobenzene was used in place of 16.03 g of 2,4-dichlorotoluene. Thus, a polymer (11) was obtained.

This polymer had a weight-average molecular weight of 2,650.

COMPARATIVE SYNTHESIS EXAMPLE 2

In 290 g of isopropyl alcohol were dissolved 77.04 g of methyltrimethoxysilane and 2 g of acetic acid. This solution was stirred with Three-One Motor to keep the solution temperature at 60° C. Subsequently, 84 g of ion-exchanged water was added to the solution over 1 hour, and the resultant mixture was reacted at 60° C. for 2 hours to thereby obtain a liquid reaction mixture (1) (condensate).

The condensate thus obtained had a weight-average molecular weight of 1,500.

EXAMPLE 1

In 18 g of cyclohexanone was dissolved 2 g of the polymer (1) obtained in Synthesis Example 1. This solution was filtered through a filter made of polytetrafluoroethylene (Teflon) having an opening diameter of 0.2 μm to obtain a composition for film formation of the invention.

The composition obtained was applied to a silicon wafer by spin coating.

The coating film obtained was examined for dielectric constant. As a result, the dielectric constant thereof was found to be 2.89, which is lower than 3. The coating film developed no cracks even when having a thickness of 5 μm, showing that it had high cracking resistance. Furthermore, the 1% weight decrease temperature of the coating film was measured and found to be 492° C., showing that the coating film had excellent heat resistance.

EXAMPLES 2 TO 10

The compositions shown in the Table below were evaluated in the same manner as in Example 1.

TABLE

| Example | Kind of polymer (g) | Organic solvent (g) | Dielectric constant | Cracking resistance | Td1 (° C.) |
|---|---|---|---|---|---|
| 1 | Polymer (1) (2 g) | Cyclohexane (18 g) | 2.89 | ○ | 492 |
| 2 | Polymer (2) (2 g) | Cyclopentane (18 g) | 2.92 | ○ | 495 |
| 3 | Polymer (3) (2 g) | Cyclohexane (18 g) | 2.92 | ○ | 495 |
| 4 | Polymer (4) (2 g) | Cyclohexane (18 g) | 2.95 | ○ | 467 |
| 5 | Polymer (5) (2 g) | Cyclohexane (18 g) | 2.91 | ○ | 464 |
| 6 | Polymer (6) (2 g) | Cyclohexane (18 g) | 2.97 | ○ | 472 |
| 7 | Polymer (7) (2 g) | Cyclohexane (18 g) | 2.87 | ○ | 493 |
| 8 | Polymer (8) (2 g) | Cyclohexane (18 g) | 2.92 | ○ | 487 |
| 9 | Polymer (9) (2 g) | Cyclohexane (18 g) | 2.91 | ○ | 484 |
| 10 | Polymer (10) (2 g) | Cyclohexane (18 g) | 2.86 | ○ | 495 |

COMPARATIVE EXAMPLE 1

Evaluations were conducted in the same manner as in Example 1, except that the polymer (11) obtained in Comparative Synthesis Example 1 was used.

The coating film had a dielectric constant of 2.95 and showed satisfactory cracking resistance when the film thickness was 5 μm. However, the 1% weight decrease temperature thereof was 365° C., showing that this coating film had poor heat resistance.

COMPARATIVE EXAMPLE 2

Evaluations were conducted in the same manner as in Example 1, except that the liquid reaction mixture (1) obtained in Comparative Synthesis Example 2 was used alone.

The coating film had a dielectric constant of 2.98 and a 1% weight decrease temperature of 455° C. However, the coating film cracked when having a thickness of 5 μm, showing that it had poor cracking resistance.

EXAMPLE 11

In 18 g of cyclohexanone were dissolved 2 g of the polymer (1) obtained in Synthesis Example 1 and 0.04 g of vinyltrimethoxysilane. This solution was filtered through a filter made of polytetrafluoroethylene (Teflon, manufactured by E.I. du Pont de Nemours & Co.) having an opening diameter of 0.2 μm to obtain a composition for film formation of the invention.

The composition obtained was applied to a silicon wafer by spin coating.

The coating film obtained was examined for dielectric constant. As a result, the dielectric constant thereof was found to be 2.97, which is lower than 3. The 2% weight decrease temperature of the coating film was measured and found to be 480° C., showing that the coating film had excellent heat resistance. Furthermore, the coating film did not crack upon immersion in water. The composition sample was applied to a 8 inch silicon wafer having thermally oxidative $SiO_2$ of 1,000 angstroms by spin coating. This coated substrate was burned on a hot plate at 100° C. for 1 minutes and then burned in a 420° C. hot plate in a nitrogen atmosphere for 12 minutes. The substrate with a coating film was dipped in hot water at 60° C. for 2 hours. 10 stud pins were fixed on the substrate thus obtained using an epoxy resin, followed by drying at 150° C. for 1 hours. Those stud pins were subjected to a pulling test using a Sebastian method, and adhesiveness was evaluated. As a result, no peeling was observed at the interface between the silicon wafer and the coating film for all ten stud pins.

EXAMPLE 12

In 18 g of cyclohexanone were dissolved 2 g of the polymer (1) obtained in Synthesis Example 1 and 0.1 g of 2,3-dimethyl-2,3-diphenylbutane. This solution was filtered through a filter made of polytetrafluoroethylene (Teflon, manufactured by E.I. du Pont de Nemours & Co.) having an opening diameter of 0.2 μm to obtain a composition for film formation of the invention.

The composition obtained was applied to a silicon wafer by spin coating.

The coating film obtained was examined for dielectric constant. As a result, the dielectric constant thereof was found to be 2.97, which is lower than 3. The coating film developed no cracks even when having a thickness of 5 μm, showing that it had high cracking resistance. The 1% weight decrease temperature of the coating film was measured and found to be 467° C., showing that the coating film had excellent heat resistance. Furthermore, even when the coating film was subjected to CMP, it showed no undesirable changes.

Further, the coating film was CMP polished under the following conditions.

Slurry: Silica-hydrogen peroxide type

Polishing pressure: 400 g/cm$^2$

Polishing time: 180 seconds

From a film thickness change of the coating film before and after CMP and an appearance test with a lamp for a surface observation of 350,000 luxes, the film thickness changes was 2% or less, and scratch or peeling was not observed on the coating film.

EXAMPLE 13

In 18 g of γ-butyrolactone were dissolved 2 g of the polymer (1) obtained in Synthesis Example 1 and 0.05 g of 7-hydroxy-5-methyl-1,3,4-triazaindolizine. This solution was filtered through a filter made of polytetrafluoroethylene (Teflon, manufactured by E.I. du Pont de Nemours & Co.) having an opening diameter of 0.2 μm to obtain a composition for film formation of the invention.

The composition obtained was applied to a silicon wafer by spin coating.

The coating film obtained was examined for dielectric constant. As a result, the dielectric constant thereof was found to be 2.98, which is lower than 3. The 2% weight decrease temperature of the coating film was measured and found to be 480° C., showing that the coating film had excellent heat resistance. Furthermore, the coating film was evaluated for the ability to prevent copper diffusion. As a result, this coating film showed a copper diffusion amount not larger than that of coating films formed from TEOS by CVD.

According to the invention, a composition for film formation (material for interlayer insulating film formation) having an excellent balance among heat resistance, low-dielectric characteristics, cracking resistance, and other properties can be provided by using a composition containing a poly(arylene ether) having a specific structure.

Further, the composition sample was applied to a 8 inch silicon wafer having on the surface thereof a plated copper having a thickness of 10 nm, by spin coating. The coated substrate was burned on a hot plate at 100° C. for 1 minutes and then burned on a 420° C. hot plate in a nitrogen atmosphere for 15 minutes. The substrate was further heated at 450° C. for 2 hours, and a copper diffusion amount in the coating film was evaluated using SIMS (Secondary Ionic Mass Spectroscopy). The coating film was evaluated for the ability to prevent copper diffusion. As a result, this coating film showed a copper diffusion amount not larger than that of coating film formed from TEOS polymer (tetraethoxysilane polymer) by CVD.

What is claimed is:

1. A composition for film formation, comprising:
   50 mole % or more of a ploymer having repeating structural units represented by the following formula (1), said structral unit having one or more alkyl groups therein:

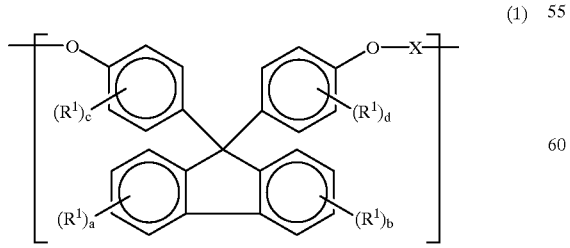

(1)

wherein $R^1$'s are the same or different and each represents an alkyl group;

wherein a to d are the same or different and each is an integer of 0 to 4; and wherein X in formula (1) is at least one group selected from groups (A) to (L) represented by the following formula (2):

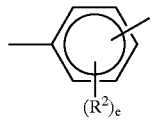
(A)

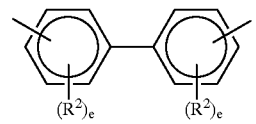
(B)

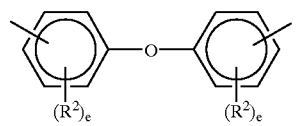
(C)

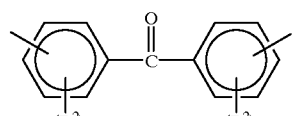
(D)

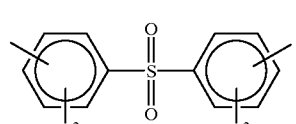
(E)

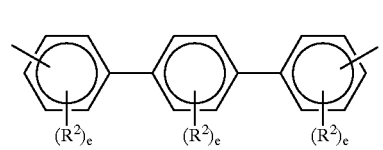
(F)

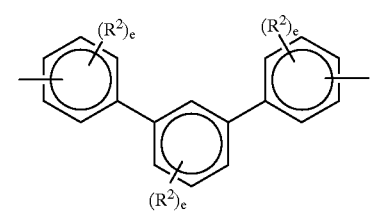
(G)

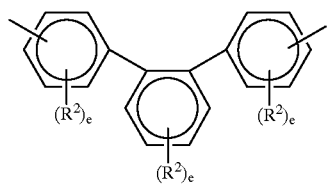
(H)

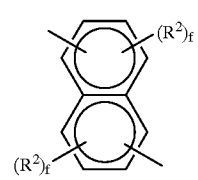
(I)

-continued

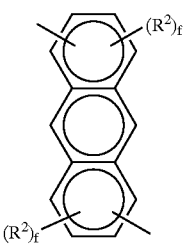
(J)

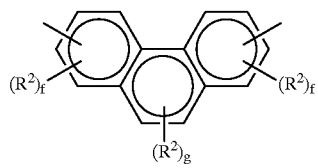
(K)

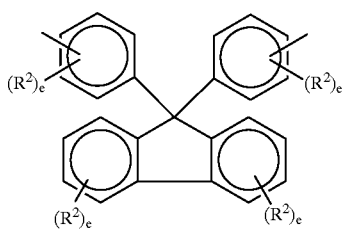
(L)

wherein R²'s are the same or different and each represents an alkyl group;

wherein e's are the same or different and each is an integer of 0 to 4;

wherein f's are the same or different and each is an integer of 0 to 3; and wherein g's are the same or different and each is an integer of 0 to 2; and wherein the polymer has at least one repeating structural unit represented by the formula (1) wherein a+b+c+d is 1 or larger.

2. The composition for film formation of claim 1, wherein the polymer has both at least one repeating structural unit represented by formula (1) wherein a+b+c+d is 1 or larger and at least one repeating structural unit represented by formula (1) wherein a+b+c+d is 0.

3. The composition for film formation of claim 1, wherein X in formula (1) is a group having one or more alkyl groups.

4. The composition for film formation of claim 1, wherein the polymer has at least one repeating structural unit represented by the formula (1) wherein X is a group having alkyl groups.

5. The composition for film formation of claim 1, wherein the polymer contains both at least one repeating structural unit represented by formula (1) wherein X is a group having one or more alkyl groups and at least one repeating structural unit represented by formula (1) wherein X is a group having no alkyl groups.

6. An insulating film obtained by applying the composition for film formation of claim 1 to a substrate and heating the coating film.

* * * * *